United States Patent
Kimppa et al.

(10) Patent No.: US 7,113,028 B2
(45) Date of Patent: *Sep. 26, 2006

(54) METHOD AND ARRANGEMENT FOR CALIBRATING AN ACTIVE FILTER

(75) Inventors: Harri Kimppa, Salo; Markus Pettersson, Turku; Kjell Östman, Salo, all of (FI)

(73) Assignee: Nokia Mobile Phones Limited, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1432 days.

(21) Appl. No.: 09/172,510

(22) Filed: Oct. 14, 1998

(65) Prior Publication Data

US 2001/0045864 A1 Nov. 29, 2001

(30) Foreign Application Priority Data

Oct. 15, 1997  (FI) .................................................. 973963

(51) Int. Cl.
 *H03K 5/00* (2006.01)

(52) U.S. Cl. ........................................ 327/553; 527/552
(58) Field of Classification Search ................. 327/559, 327/552, 553, 554, 555, 556, 557, 558; 333/172, 333/173; 330/305, 303
See application file for complete search history.

(56) References Cited

U.S. PATENT DOCUMENTS

| | | | | |
|---|---|---|---|---|
| 3,849,677 A | * | 11/1974 | Stacey et al. ................. | 333/17 |
| 3,946,328 A | * | 3/1976 | Boctor ........................ | 327/553 |
| 4,156,853 A | | 5/1979 | Peterson ..................... | 330/109 |
| 5,194,826 A | | 3/1993 | Huusko ....................... | 330/302 |
| 5,303,404 A | | 4/1994 | Kivela ....................... | 455/200.1 |
| 5,396,657 A | | 3/1995 | Jokinen ....................... | 455/307 |
| 5,416,438 A | | 5/1995 | Shibata ....................... | 327/552 |
| 5,466,976 A | * | 11/1995 | Ichihara ...................... | 333/173 |
| 5,809,399 A | | 9/1998 | Tuutijarvi et al. ............ | 455/63 |
| 5,994,951 A | * | 11/1999 | Mazhar et al. ............... | 327/553 |
| 6,259,311 B1 | * | 7/2001 | Azimi et al. ................. | 327/553 |

FOREIGN PATENT DOCUMENTS

| | | |
|---|---|---|
| EP | 0 477 694 A3 | 4/1992 |
| EP | 0 539 684 A1 | 5/1993 |

* cited by examiner

*Primary Examiner*—Dinh T. Le
(74) *Attorney, Agent, or Firm*—Perman & Green, LLP

(57) ABSTRACT

The invention relates to a calibration method and a calibration arrangement for an active filter intended to be used especially in portable radio apparatus. The filter (100) according to the invention is an active RC filter and it is integrated except for one or more of its capacitances or one or more of its resistances. Advantageously the highest capacitance or the highest resistance is left unintegrated. When using an external capacitance, the principle of the calibration is as follows: The integrated resistances are corrected using a common coefficient such that the external capacitance together with the integrated resistances produces the correct time constants (1). Then the integrated capacitances are corrected using a common coefficient such that they together with the internal resistances that were corrected in the previous phase produce the correct time constants (2). If the filter comprises multiple circuit stages, the two-phase calibration process described above is repeated for each circuit stage.

31 Claims, 7 Drawing Sheets calibration phases (1), (2), (3) and (4)

calibration phases (1), (2), (3) and (4)

$S_r = b0\ b1\ b2\ b3\ b4$ $S_c = b0\ b1\ b2\ b3\ b4$

METHOD AND ARRANGEMENT FOR CALIBRATING AN ACTIVE FILTER

FIELD OF THE INVENTION

The invention relates to a calibrating method for an active filter which may be used especially in, portable radio apparatus. The invention also relates to a calibration arrangement for an active filter.

BACKGROUND ART

Conventionally, low-frequency filters have been manufactured passive also. Their disadvantages include in particular the non-idealness caused by coils, the large size and relatively high production costs. Active filters realized using discrete components do not have the disadvantages caused by coils, but because of the number of components they, too, are space-consuming and have relatively high production costs.

An active filter can be realized in a small space by integrating it to a microcircuit. The problem with such filters is the large area required by the capacitances on the chip. Integration is possible if the capacitances are made very small and correspondingly the resistances very big. This means, however, that the signal level will drop and the noise level will increase and, therefore, this solution is usually unacceptable. Integration is possible also if small capacitances are used with very high virtual resistances based on the switched capacitor (SC) or switched current (SI) technology, for example. This eliminates high thermal noise levels, but the use of switches will result in the increase of noise level, increased current consumption and deterioration of the linearity of the filter. The latter will limit the dynamic range of the filter. If the apparatus in question is a radio device, the use of switches may also cause interference problems in the RF circuits of the apparatus. The filter may also be made such that the parts that are difficult to integrate are left outside the micro circuit. A disadvantage of such a construction is that calibration becomes more difficult; The filter requirements are usually so strict that, regardless of the construction, calibration is necessary because of the variation in component values. In the mixed construction mentioned above the deviations of the values of discrete and integrated components do not correlate, which means the calibration of filters in production may cause higher costs than totally discrete or totally integrated filters.

SUMMARY OF THE INVENTION

It is an object of the invention to eliminate above-mentioned disadvantages related to the prior art. The basic idea of the invention is as follows: The filter is an active RC filter and it is integrated except for one or more of its capacitances or one or more of its resistances. Advantageously the highest capacitance or highest resistance is left unintegrated, that is external to the filter. Each external capacitance is advantageously realized by a chip capacitor placed beside the integrated circuit. The principle of calibration, when using an external capacitance, is as follows: Integrated resistances are corrected by a common coefficient such that the external capacitance produces the correct time constants with them. Then the integrated capacitances are corrected by a common coefficient such that they produce the correct time constants with the internal resistances corrected in the previous phase. If the filter has multiple circuit stages, the two-phase calibration procedure described above is repeated for each circuit stage.

It is an advantage of the invention that the filter according to the invention can be made relatively small and it consumes a relatively small amount of energy. It is another advantage of the invention that the filter according to the invention is of good quality: It has a good signal-to-noise ratio, a large dynamic range, and it does not cause RF interference in its surroundings. It is a further advantage of the invention that the calibration of the filter can be adapted such that it is automatic and needs no external measuring instruments so that the calibration costs in the production are very low.

BRIEF DESCRIPTION OF THE DRAWINGS

The invention will now be described in more detail with reference to the accompanying drawings wherein.

FIG. 3A is a conceptual representation of a circuit in accordance with FIG. 3, which indicates that all capacitors are changed to resistors, and all resistors are changed to capacitors.

DETAILED DESCRIPTION OF THE PREFERRED EMBODIMENTS

Figure 1:
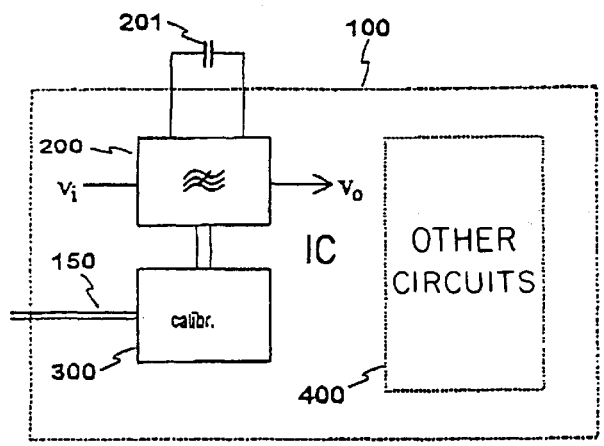
FIG. 1 shows a filter arrangement according to the invention.

FIG. 1 shows a filter arrangement according to the invention comprising a microcircuit 100 which comprises a filter circuit 200, filter calibrating circuit 300 and possible other electronic circuits 400. FIG. 1 additionally shows a bus 150 for controlling the filter calibration and an external capacitor 201 of the filter, located outside the microcircuit. The external component in this example is a capacitor and there is just one of them.

Figure 2:
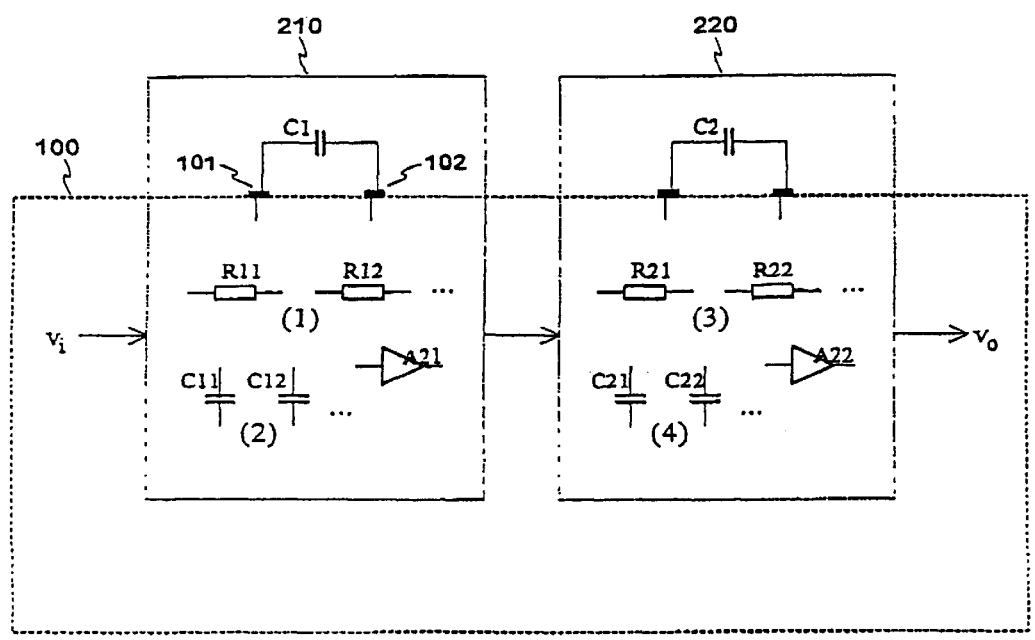
FIG. 2 illustrates the calibrating principle according to the invention.
Figure 2A:
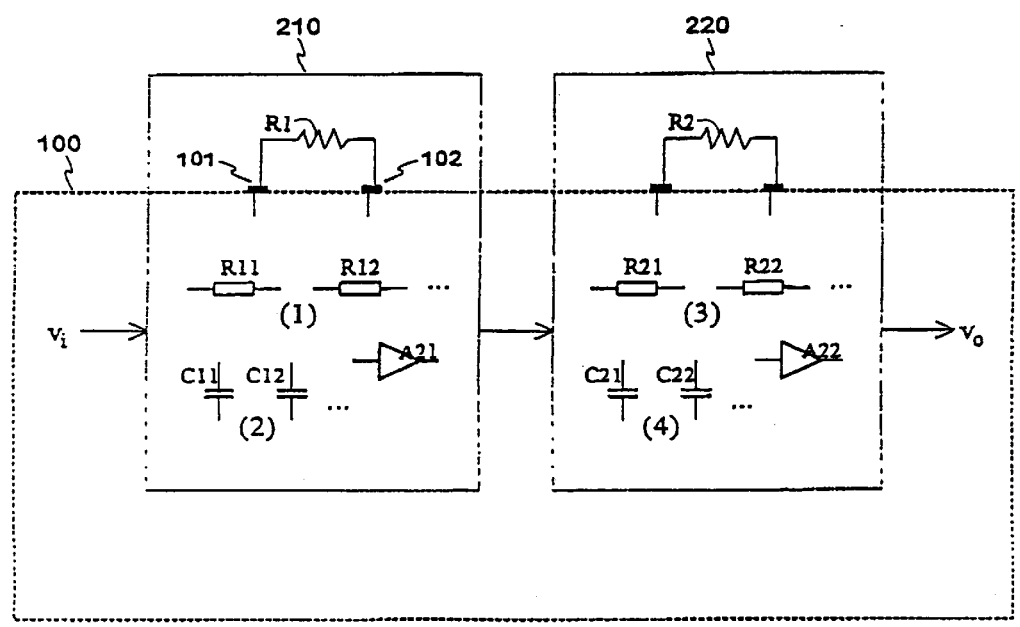
FIG. 2A illustrates the calibrating principle for another embodiment of the invention.

The calibration of filters according to the invention is carried out by adjusting the time constants in phases. FIG. 2 shows component parts of a filter comprising two circuit stages 210 and 220. The detailed construction of The filter is of no significance at this point. Circuit stage 210 comprises variable resistances R11 and R12, connected in series/longitudinally on the signal line, and variable capacitances C11 and C12, connected in parallel/transversely to the signal line. The circuit stage further comprises an external capacitance C1, connected to the rest of the filter via connector pins 101, 102 of the integrated circuit, and an amplifier stage A21. The second circuit stage 220 includes variable resistances R21 and R22, variable capacitances C21 and C22, an external capacitance C2 and an amplifier stage A22. Thus there are four phases in calibration of the filters. Let us assume that time constants R11·C1=T1, R12·C11=T2, R21·C2=T3 and R22·C21=T4 are critical for the filter's frequency response. In phase (1) the resistance R11 is adjusted, as well as the other resistances in circuit 210, until the time constant T1 is correct. In phase (2) the capacitance C11 is adjusted, as well as the other integrated capacitances in circuit 210, until the time constant T2 is correct. Correspondingly, in phase (3) the resistances in circuit 220 are adjusted until the time constant T3 is correct, and in phase (4) the integrated capacitances in circuit 220 are adjusted until the time constant T4 is correct. After that, the filter's frequency response is correct and the calibration of the filter is finished.

Figure 3:
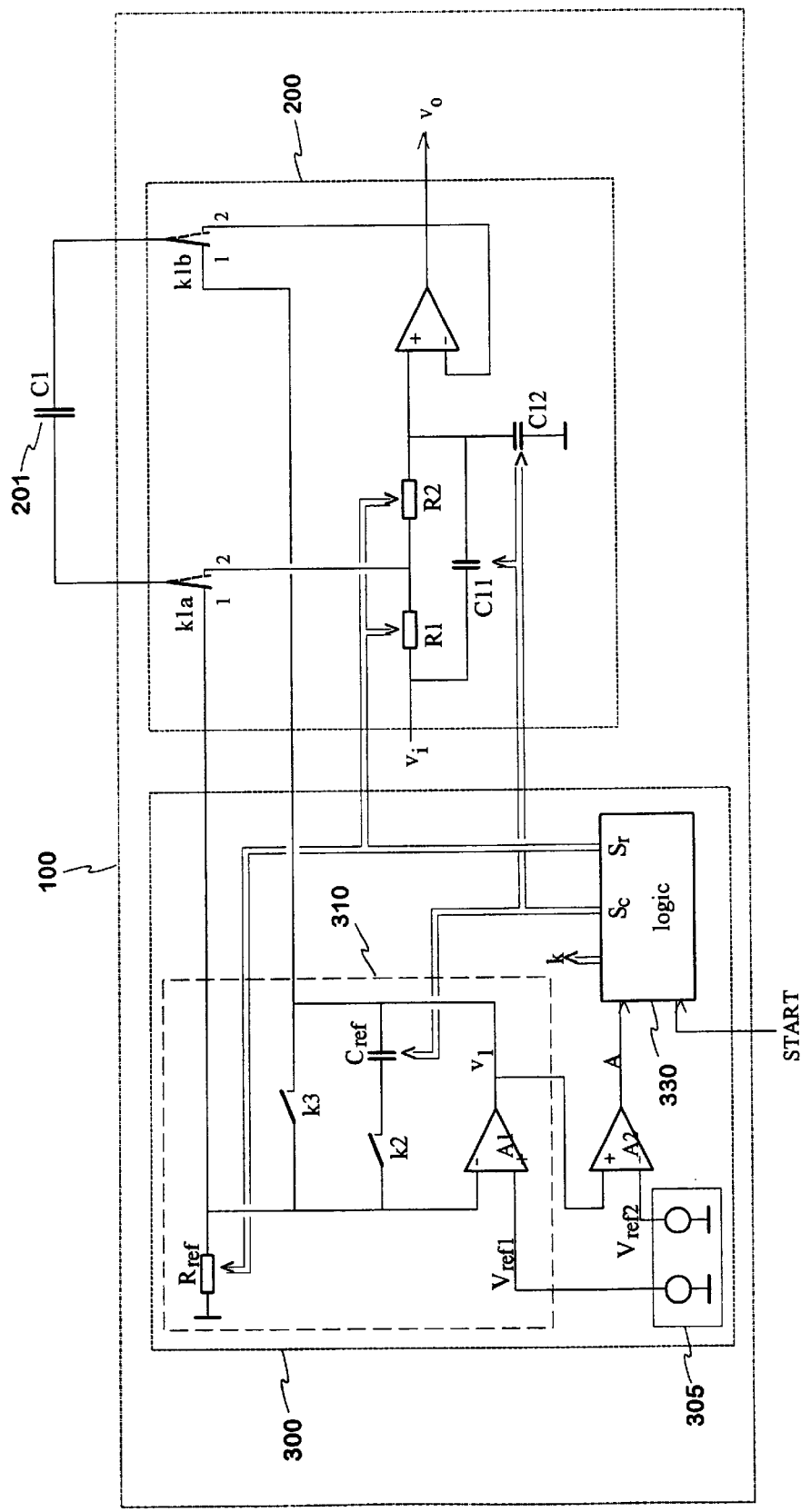
FIG. 3 shows an example of a filter circuit and calibrating circuit according to the invention.

FIG. 3 shows a single-circuit-stage low-pass filter 200, 201, and its calibrating circuit 300. Both are examples of solutions according to the invention. The filter has an integrated part 200 and an external capacitor 201 (C1). By means of change-over switches k1a and k1b the latter can be made part of the filter or the calibrating circuit. The calibrating circuit 300 has an integrator 310, which comprises an amplifier A1, a comparator A2, logic unit 330 and a circuit 305 for generating reference voltages $V_{ref1}$ and $V_{ref2}$. In the integrator 310 constant current is used to charge capacitance C1 or $C_{ref}$, depending on the phase of the calibration. The magnitude of the constant current depends on voltage $V_{ref1}$ and resistance $R_{ref}$. In parallel with the capacitance charged there is a switch k3 by means of which the capacitance is discharged before a new charge cycle. Comparator A2 compares the integrator's output voltage $v_1$ with voltage $V_{ref2}$ which is greater than $V_{ref1}$. If during the integration cycle voltage $v_1$ reaches voltage $V_{ref2}$, the comparator's output signal A is set to "1", otherwise it remains at "0". Comparator A2 is connected to the logic unit 330. From outside the microcircuit 100 a control signal START is brought to the logic unit to start the calibration process. The logic unit 330 controls the flow of the calibration on the basis of the state of the comparator's output signal A by setting the switches k1, k2 and k3 as well as the integrated resistance values by setting a control word $S_r$, and the integrated capacitance values by setting a control word $S_c$.

Because of the manufacturing process the resistance values in the microcircuit deviate from their nominal values in the same direction and proportionally to the same extent. Similarly, the capacitance values deviate from their nominal values proportionally to the same extent. Because of this, the calibration may use the integrated reference resistance $R_{ref}$ and capacitance $C_{ref}$ instead of the component parts in the filter so that there will be no need to work with the integrated filter construction in order to adjust its component values. The resistances R1 and R2 in the filter construction and $R_{ref}$ in the calibrating circuit are adjustable. The adjustment is carried out using a common control word $S_r$, so that their values always change in proportion. Correspondingly, the capacitances C11 and C12 in the filter construction and $C_{ref}$ in the calibrating circuit are adjustable by a common control word $S_c$.

Figure 4:
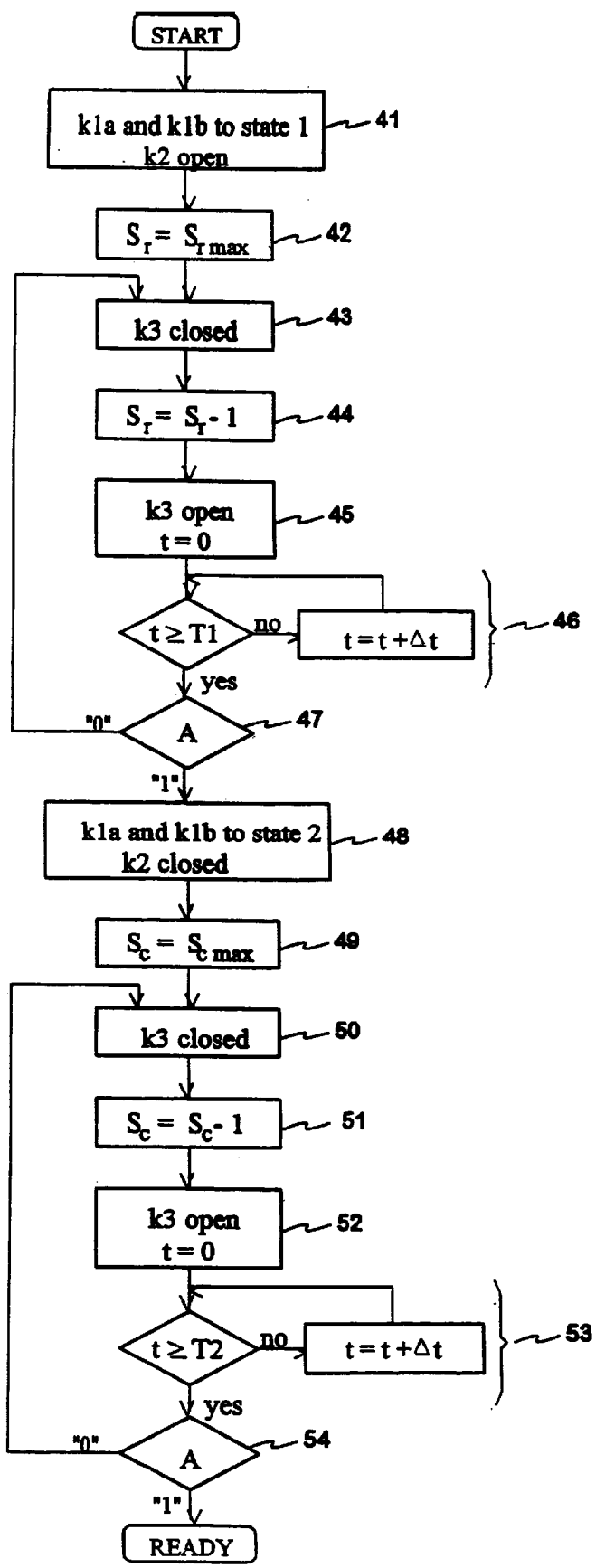
FIG. 4 illustrates in the form of flow diagram the operation of the calibrating circuit according to FIG. 3.

FIG. 4 shows a flow diagram of the calibration process of the circuit in FIG. 3. After the start, in step 41 the external capacitance C1 is connected to be the capacitance of the integrator in the calibrating circuit. In step 42, the logic unit sends the value $S_{rmax}$ representing the maximum resistances to the register controlling the resistance values. In step 43, switch k3 in parallel with the integrator's capacitance is closed, thereby discharging the possible charge of the capacitance and setting the integrator's output voltage $v_1$ to $V_{ref1}$. In step 44, the values of the internal resistances in the microcircuit are decremented by one step. This is of no significance during the first cycle of the process. Next, in step 45, switch k3 is opened, starting the charging of capacitance C1. Time is counted in step 46. After a predetermined time T1 the state of the output signal A of the comparator A2 is checked in step 47. If the output voltage $v_1$ of the integrator has not yet reached $V_{ref2}$, signal A is in state "0" and the voltage integration cycle is repeated using a resistance $R_{ref}$ value one step smaller than before (steps 43 to 47). Time constant $R_{ref}$·C1 will then be a little smaller, making the voltage $v_1$ to increase a little faster than in the previous cycle. The cycle will be repeated until the voltage $v_1$ reaches $V_{ref2}$ in time T1, indicated by state "1" of signal A. Parameter T1 is chosen such that time constant R1·C1 will then conform to the desired transfer function. The microcircuit's internal resistance values, R2 included, will not be changed after this.

Steps 48 to 54 in FIG. 4 represent the second phase of the calibration process. Certain values have to be set for time constants R2·C11 and R2·C12 in order to fulfill the desired transfer function of the exemplary filter. First, in step 48, external capacitance C1 is connected to its place in the filter and internal capacitance $C_{ref}$ is connected to the integrator. The ratio of capacitance $C_{ref}$ to capacitance C11 is known. Similarly, the ratio of resistances $R_{ref}$ and R2 is known. Thus it is possible to determine the time T2 in which the integrator's output voltage should reach voltage $V_{ref2}$ for time constant R2·C11 to be correct. The second phase of the calibration goes on in a similar manner as the first phase. Only, now the internal capacitances are first set to their maximum values, step 49, and then gradually decreased until it is detected that signal A is in state "1", steps 50 to 54. Time constant R2·C11 is then correct. Time constant R2·C12 is also correct, because the ratio C12/C1 was correct from the beginning and it is not changed during the calibration. The end result of the calibration is that individual component values are not known but all critical time constants and resistance ratios are substantially correct.

Figure 5:
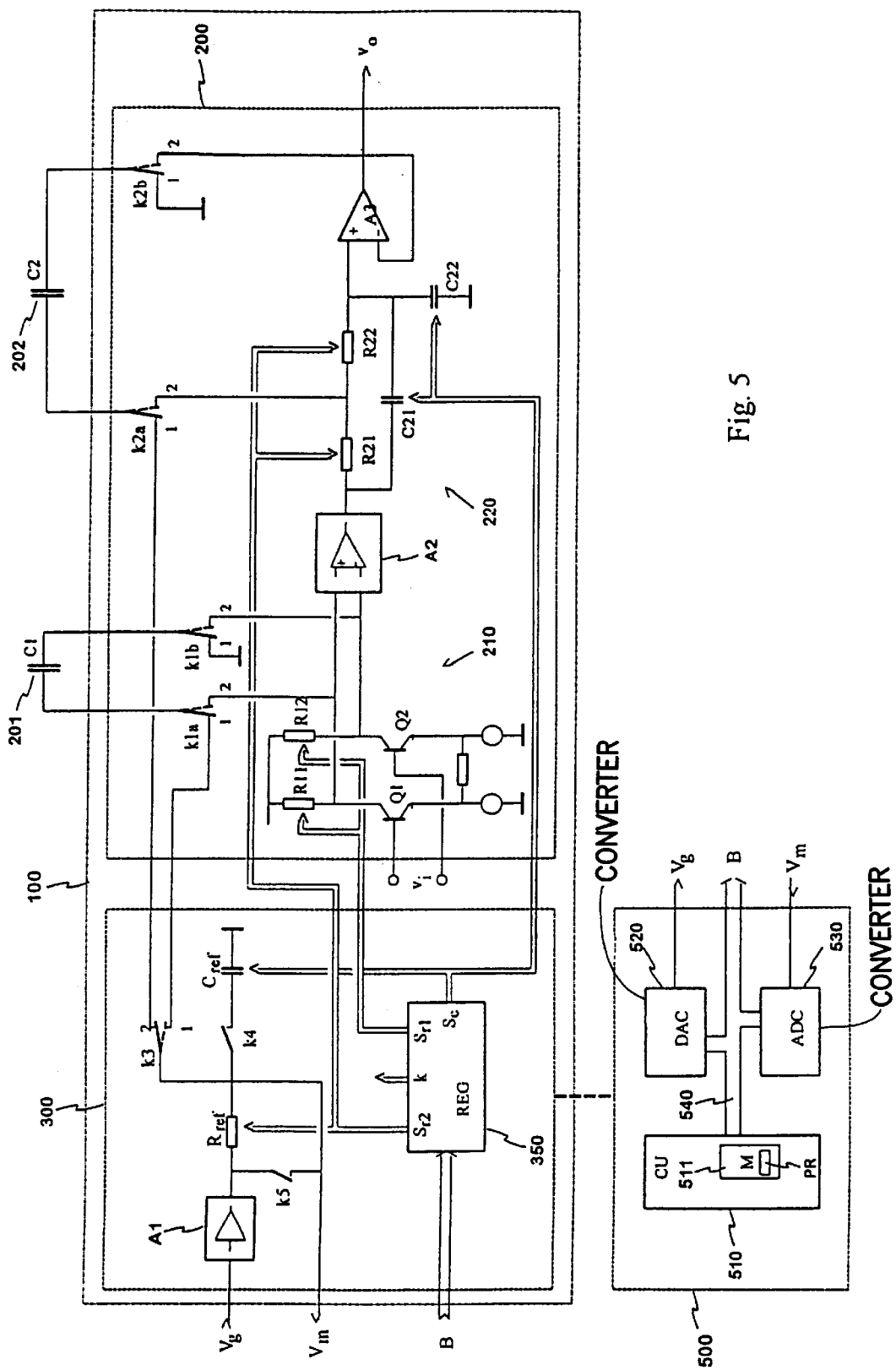
FIG. 5 shows another example of a filter circuit and calibrating circuit according to the invention.

FIG. 5 shows another calibrating arrangement according to the invention. In this example the filter 200, 201, 202 to be calibrated is a third-order low-pass filter comprising a first circuit stage 210, differential amplifier A2 and a second circuit stage 220. The first circuit stage 210 is a differential amplifier realized by transistors Q1 and Q2. It is integrated except for an external capacitor 201 (C1) which determines the cut-off frequency. Said capacitor can be connected by change-over switches k1a, k1b either to the calibrating circuit or to the filter. Calibration is directed to collector resistors R11, R12 in transistors Q1, Q2. The second circuit stage 220 is a second-order biquad-type filter realized by amplifier A3, as the filter in FIG. 3. It is integrated except for an external capacitor 202 (C2). Said capacitor can be connected by change-over switches k2a, k2b either to the calibrating circuit or to the filter. Calibration is directed to resistors R21, R22 and capacitors C21, C22. The calibrating arrangement in FIG. 5 comprises an integrated calibrating circuit 300 and an external calibrating system 500. The calibrating circuit 300 comprises a differential amplifier A1, reference resistor $R_{ref}$, reference capacitor $C_{ref}$, register unit 350 and switches k3, k4 and k5. The register unit 350 comprises registers k, $S_{r1}$, $S_{r2}$ and $S_c$, $S_{r1}$, $S_{r2}$ and $S_c$ also represent the contents of the respective registers. The external system 500 comprises a control unit 510, digital-to-analog converter 520, analog-to-digital converter 530 and a bus 540. The control unit 510 comprises a memory 511 in which a calibrating program PR is stored. The output voltage $V_g$ of die digital-to-analog converter is taken to the differential amplifier A1 in the calibrating circuit 300. The calibration measurement voltage $V_m$ is brought from the calibrating circuit 300 to the analog-to-digital converter 530. Converter 520 is controlled and converter 530 is read through bus 540. The bus 540 also extends to the register unit 350 in the calibrating circuit 300.

If the filter to be calibrated belongs to a digital mobile communications device, the digital-to-analog converter 520 is preferably a converter in the modulator of the mobile communications device. Similarly, the analog-to-digital converter 530 is preferably a convener in the demodulator of the mobile communications device. The control unit 510 and its memory may in that case belong to the mobile communications device or they may reside in a separate apparatus.

Adjustment of filter time constants in the example of FIG. 5 is based on checking the frequency responses of the first-order RC circuits from signal amplitudes. To that end, the external system 500 generates a sinusoidal voltage $V_g$ such that the control unit 510 feeds to the digital-to-analog converter 520 a number sequence from the memory 511 which corresponds to samples taken from the sine wave. The converter 520 is controlled at such a rate that the frequency of the sine wave $V_g$ generated is in the same order of magnitude as the cut-off frequency of the low-pass filter to be calibrated. The voltage $V_g$ is taken via a differential amplifier A1 to the input of a first-order RC low-pas filter. The low-pass filter comprises, series connected, resistor $R_{ref}$ and one of capacitors C1, C2 and $C_{ref}$. Selection is made with switches k1, k2, k3 and k4. The position of the switches depends on the number sent by the control unit 510 to register k in the register unit 350. The output voltage $V_m$ of the low-pass filter is taken from between resistor $R_{ref}$ and capacitor $C_n$ (n=1, 2, ref). The voltage $V_m$ is led to the analog-to-digital converter 530. The control unit 510 reads the converter 530 and produces on the basis of die numbers received a reference number that corresponds to the amplitude of voltage $V_m$.

The calibrating circuit 300 includes a switch k5 connected in parallel with resistor $R_{ref}$. When the switch is closed, voltage $V_m$ becomes the output voltage of the differential amplifier A1. Let this unattenuated voltage be $V_0$. When switch k5 is open, voltage $V_m$ is smaller than voltage $V_0$ because of the attenuation caused by the filter $R_{ref}$, $C_n$. Let this attenuated voltage be $V_n$. The control unit calculates on the basis of the values of voltages $V_0$ and $V_n$ the time constant $R_{ref} \cdot C_n = T_n$ of the filter $R_{ref}$, $C_n$ being measured. Naturally the frequency value, which is in the control unit's memory, is also needed in the calculation. From the time constants $T_n$ the control unit further calculates coefficients for the integrated resistors and capacitors such that all time constants of the filter calibrated are substantially correct. The control unit 510 sends said coefficients to the register unit 350. Number $S_{r1}$ determines the resistance values R11 and R12 in circuit stage 210, number $S_{r2}$ determines the resistance values R21 and R22 in circuit stage 220, and number $S_c$ determines the capacitance values C21 and C22 in circuit stage 220.

Figure 6:
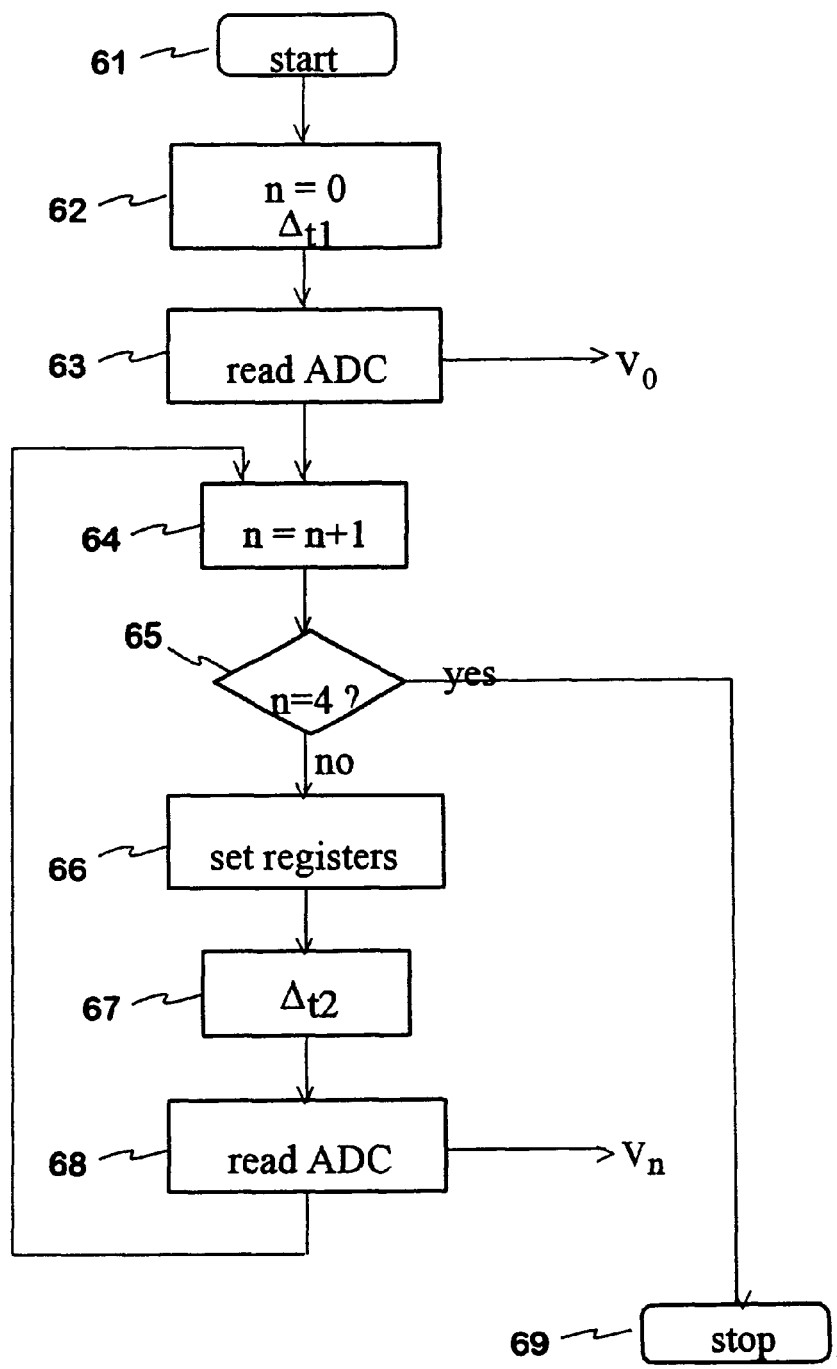
FIG. 6 illustrates in the form of flow diagram the operation of the calibrating circuit according to FIG. 5.

The calibrating process for the structure in FIG. 5 is in accordance with FIG. 6, for example. Step 61 comprises preliminary actions such as activating the functional units and starting the generation of the sine wave used in the measurements. In step 62 variable n, which indicates the phase of the calibration, is set to state 0. This causes switch k5 to close so that the measurement signal $V_g$ will bypass the filters used in the measurement. In addition, step 62 comprises a certain delay $\Delta t1$ so that voltage $V_m$ will have time to settle before the analog-to-digital converter 530 is read. That reading takes place in step 63. As a result of the read, the calibration control program PR generates a voltage value $V_0$ in which there is no attenuation caused by the filter measured. In step 64 the value of variable n is increased by one, which represents a transition to the next calibration phase. In phases 1, 2 and 3 the process sets the registers in the register unit 350 as needed (step 66), waits for a certain period of time $\Delta t2$ (step 67), reads the converter 530 (step 68) and generates a value $V_n$ for the voltage measured. When n is one, change-over switches k1a, k1b and k3 are set to state 1 and switches k4 and k5 are set to "open" so that external capacitor C1 of the microcircuit 100 is connected in series with resistor $R_{ref}$ and the other end of the capacitor is connected to ground. On the basis of measurement result $V_1$ the program PR calculates a calibration coefficient for testators R11, R12 in circuit stage 210. When variable n is two, change-over switches k2a and k2b are set to state 1 and change-over switch k3 to state 2 go that external capacitor C2 of the microcircuit 100 is connected in series with resistor $R_{ref}$ and the other end of the capacitor is connected to ground. On the basis of measurement result $V_2$ the program PR calculates a calibration coefficient for resistors R21, R22 in circuit stage 220. At this phase the value of resistance $R_{ref}$ has to be chanced according to the coefficient mentioned above. When variable n is three, change-over switches k1a, k1b, k2a and k2b are set to state 2 and switch k4 to state "closed" so that an integrated reference capacitor $C_{ref}$ is connected in series with resistor $R_{ref}$ such that the other end of said capacitor is fixed to ground. On the basis of measurement result $V_3$ the program PR calculates a calibration coefficient for capacitors C21, C22 in circuit stage 220. When variable n is four, the process in this example enters in accordance with step 65 the final calibration phase 69 in which the generation of the measurement signal $V_g$ is ceased, among other things. The calibration coefficients loaded into registers Sr1, Sr2 and Sc remain in the registers.

The examples depicted in FIGS. 5 and 6 have one filter to be calibrated. If, for example, the apparatus has got quadrature branches for the baseband signal, there are two similar filters to be calibrated which are preferably integrated on one circuit. There will then be more calibration phases, of course. If, for example, the filters are as in FIG. 5, the calibration of the resistances of both circuit stages in both filters need phases of their own. However, one measurement will suffice to set the capacitances of the latter circuit stages.

Figure 7A:
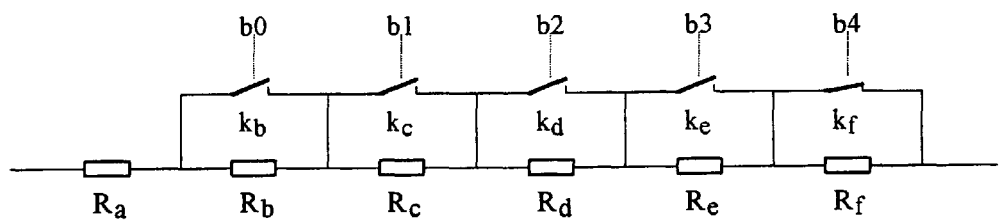
FIG. 7 shows an example of a way of adjusting resistance and capacitance.

FIG. 7 shows an example of how the internal resistances and capacitances in the microcircuit can be adjusted. FIG. 7a shows a variable resistance. It comprises six resistances $R_a$, $R_b$, $R_c$, $R_d$, $R_e$ and $R_f$ in series which, except for resistance $R_a$, can be short-circuited. Resistance $R_b$ can be short-circuited by switch $k_b$ which is controlled by a digital signal b0. Correspondingly, resistance $R_c$ can be short-circuited by switch $k_c$ controlled by a digital signal b1, etc. Thus the overall resistance R is derived as follows:

$$R = R_a + b0 \cdot R_b + b1 \cdot R_c + b2 \cdot R_d + b3 \cdot R_e + b4 \cdot R_f.$$

State "0" of bits b0 to b4 corresponds to open switch and state "1" corresponds to closed switch. Then the byte b0 b1 b2 b3 b4 corresponds in FIGS. 3 to 6 to the resistance control signal $R_r$. When all bits are "ones", the resistance is at the highest ($R_{max} = R_a + R_b + R_c + R_d + R_e + R_f$), and when all bits are zeros, the resistance is at the lowest ($R_{min} = R_a$). Let us assume that the overall tolerance of the product of the external capacitance and the integrated resistance is about ±25%. Then the circuit is manufactured e.g. in such a manner that $R_b = 0.32 R_a$, $R_c = 0.16 R_a$, $R_d = 0.08 R_a$, $R_e = 0.04 R_a$ and $R_f = 0.02 R_a$. Now the control byte b0 ... b4 can be used to choose the resistance from the range $R_a$ ... $1.6 R_a$ with a resolution of $0.02 R_a$. The value $1.3 R_a$ corresponds to the nominal value of the resistance in question. Naturally the resolution of the adjustment can be improved by increasing the number of resistances, switches and control bits.

Figure 7B:
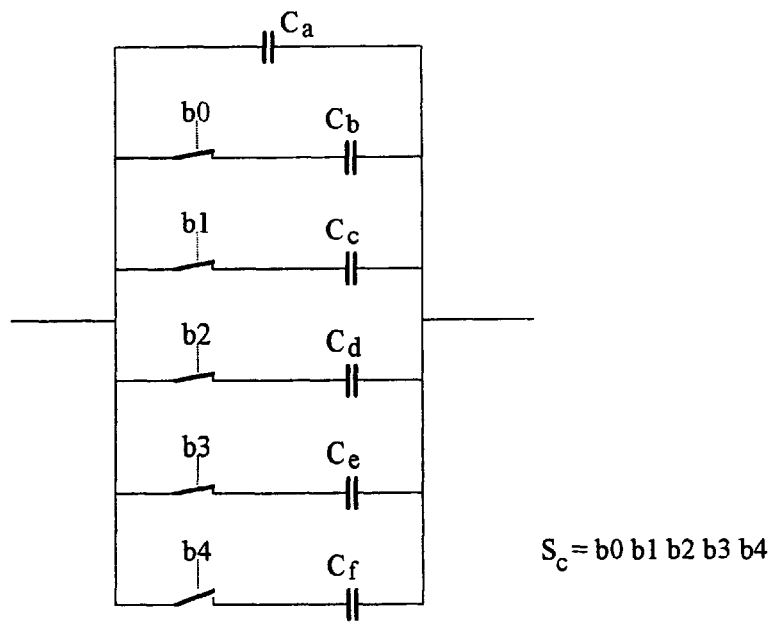

FIG. 7b shows an example of a variable capacitance. The arrangement is similar to the one above. For the total capacitance we get $$C=C_a+b0 \cdot C_b+b1 \cdot C_c+b2 \cdot C_d+b3 \cdot C_e+b4 \cdot C_f$$

Byte b0 b1 b2 b3 b4 now corresponds to the capacitance control signal $S_c$ in FIGS. 3 to 6. The partial capacitances are chosen such that the adjustment range of the total capacitance covers the tolerance for the product of the integrated resistance and capacitance added to the tolerance for the external capacitance.

Above it was described examples of filter calibration according to the invention. The invention is not limited to the arrangements described above. The filter may as well be any analog active filter the operation of which is not based on clock signals such as the clock signals of SC filters. It is possible to have various implementations for the measuring circuits that are used in the calibration circuit of the filter for measuring the charging time of die capacitor or the attenuation of the sine voltage. It is possible to control the time constants of the filter directly by adding switches without using integrated reference components. Calibration can also be controlled using a program run in a separate processor circuit instead of the processor circuit belonging to the measured equipment. lie structures of the variable resistances and capacitances may differ from those described. The inventional idea can be applied in various cases defined by the claims set forth below.

What is claimed is:

1. A method for calibrating an active filter comprising at least one filter stage including at least one integrated resistance and at least one integrated capacitance provided in an integrated circuit, and at least one capacitive component is placed outside the integrated circuit as an external capacitance electrically connected to the integrated circuit, said method comprising:

adjusting said at least one integrated resistance until it has, together with the at least one external capacitance, a first predetermined time constant, adjusting said at least one integrated capacitance until it has, together with said at least one integrated resistance, a second predetermined time constant, determining attenuation at a given frequency of said filter stage corresponding to at least one of said first time constant and said second time constant, calculating based on said attenuation a correction coefficient for a value of said integrated resistor or integrated capacitance on which said at least one time constant depends, and setting for said value a value in accordance with said correction coefficient.

2. The method of claim 1, wherein said at least one integrated resistance and said at least one integrated capacitance have boundary values, further comprising:

setting the integrated resistances to their boundary values and then gradually changing the values until the time constants are correct, and setting the integrated capacitances to their boundary values and then gradually changing the values until the time constants are correct.

3. The method of claim 1, wherein said filter is comprised of at least two successive circuit stages, said setting of values being carried out separately in each circuit stage.

4. The method of claim 1, wherein each of said adjusting steps further comprises using a reference resistance and a reference capacitance in said integrated circuit.

5. The method of claim 4, comprising, during calibration:

adjusting said reference resistance and the at least one integrated resistance in response to a first common control signal from a control means, and adjusting said reference capacitance and the at least one integrated capacitance in response to a second common control signal from said control means.

6. The method of claim 1, wherein the correction coefficient is detected and adjustment of the integrated capacitance and the adjustment of the integrated resistance are carried out in the same integrated circuit.

7. The method of claim 1, wherein the at least one integrated resistance and the at least one integrated capacitance are respectively adjusted by connecting resistors and capacitors in at least one of series and parallel.

8. A method for calibrating an active filter comprising at least one filter stage including at least one integrated capacitance and at least one integrated resistance in an integrated circuit, and at least one resistive component is outside said integrated circuit as an external resistance electrically connected to said integrated circuit, said method comprising:

adjusting said at least one integrated capacitance until it has, together with said external resistance, a first predetermined time constant, adjusting said at least one integrated resistance until it has, together with said at least one integrated capacitance, a second predetermined time constant, determining attenuation at a given frequency of said filter stage corresponding to at least one of said first time constant and said second time constant, calculating based on said attenuation a correction coefficient for a value of said integrated resistance or integrated capacitance on which said at least one time constant depends, and setting for said value a value in accordance with said correction coefficient.

9. The method of claim 8, wherein said at least one integrated resistance and said at least one integrated capacitance have boundary values, further comprising:

setting the integrated resistances to their boundary values and then gradually changing the values until the second time constant is correct, and setting the integrated capacitances to their boundary values and then gradually changing the values until the first time constant is correct.

10. The method of claim 8, wherein said filter is comprised of at least two successive circuit stages, said setting of values being carried out separately in each circuit stage.

11. The method of claim 8, wherein each of said adjusting steps further comprises using a reference resistance as a replacement for said integrated resistor and a reference capacitance as a replacement for said integrated capacitor in said integrated circuit.

12. The method of claim 8, comprising:

adjusting said reference resistance and the at least one integrated resistance in response to a first common control signal from a control means, and adjusting said reference capacitance and the at least one integrated capacitance in response to a second common control signal from said control means.

13. The method of claim 8, wherein the correction coefficient is detected and adjustment of the integrated capacitance and the adjustment of the integrated resistance are carried out in the same integrated circuit.

14. The method of claim 8, wherein the at least one integrated resistance and the at least one integrated capacitance are respectively adjusted by connecting resistors and capacitors in at least one of series and parallel.

15. A circuit arrangement for calibrating an active filter that comprises at least one integrated resistance, at least one integrated capacitance and at least one external capacitive component electrically connected to said filter, said circuit arrangement comprising:

means for adjusting said at least one integrated resistance so that it has, together with said external capacitance, a first predetermined time constant, and means for adjusting said at least one integrated capacitance so that it has, together with said at least one integrated resistance, a second predetermined time constant, wherein at least one of the adjusting means comprise control means including a processor equipped with an appropriate program.

16. The circuit arrangement of claim 15, wherein said means for adjusting said at least one integrated resistance and said at least one integrated capacitance comprises an RC time constant measuring circuit.

17. The circuit arrangement of claim 16, wherein said time constant measuring circuit comprises a constant voltage source, an analog integrator and an analog comparator.

18. The circuit arrangement of claim 15, wherein said at least one integrated resistance and said at least one integrated capacitance form an RC circuit, and said means for adjusting the at least one integrated resistance and the at least one integrated capacitance comprises means for determining attenuation of an RC circuit at a given frequency.

19. The circuit arrangement of claim 18, wherein the means for determining said attenuation comprises means for providing a set of digital numbers corresponding to a sine wave, a digital-to-analog converter, an analog-to-digital converter and a program for controlling said converters and calculating a magnitude of a signal output from the analog-to-digital converter.

20. The circuit arrangement of claim 19, wherein said analog-to-digital and digital-to-analog converters are for processing at least one of a modulated signal and a detected signal.

21. The circuit arrangement of claim 15, wherein the adjusting means comprise control means including a logic unit integrated into the same circuit as the filter circuit.

22. A circuit arrangement for calibrating an active filter that comprises at least one integrated capacitance, at least one integrated resistance and at least one external resistive component, comprising:

means for adjusting said at least one integrated capacitance so that it has, together with said external resistance, a predetermined time constant, and means for adjusting said at least one integrated resistance so that it has, together with said at least one integrated capacitance, a predetermined time constant, wherein the adjusting means comprise control means including a processor equipped with an appropriate program.

23. The circuit arrangement of claim 22, wherein said means for adjusting said at least one integrated resistance and said at least one integrated capacitance comprises an RC time constant measuring circuit.

24. The circuit arrangement of claim 22, wherein said at least one integrated resistance and said at least one integrated capacitance form an RC circuit, and said means for adjusting the at least one integrated resistance and the at least one integrated capacitance comprises means for determining attenuation of an RC circuit at a given frequency.

25. The circuit arrangement of claim 24, wherein the means for determining said attenuation comprises means for providing a set of digital numbers corresponding to a sine wave, a digital-to-analog converter coupled to said providing means, an analog-to-digital converter coupled to said digital-to-analog converter, and a program coupled to said providing means for controlling said converters and calculating a magnitude of a signal output from the analog-to-digital converter.

26. The circuit arrangement of claim 22, wherein the adjusting means comprise control means including a logic unit integrated into the same circuit as the filter circuit.

27. A circuit arrangement for calibrating an active filter that comprises at least one integrated resistance, at least one integrated capacitance and at least one external capacitive component electrically connected to said filter, comprising:

means for adjusting said at least one integrated resistance so that it has, together with said external capacitance, a first predetermined time constant, and means for adjusting said at least one integrated capacitance so that it has, together with said at least one integrated resistance, a second predetermined time constant, wherein said means for adjusting the at least one integrated resistance and the at least one integrated capacitance comprises means for determining attenuation of an RC circuit at a given frequency.

28. A circuit arrangement for calibrating an active filter that comprises at least one integrated resistance, at least one integrated capacitance and at least one external capacitive component electrically connected to said filter, comprising:

means for adjusting said at least one integrated resistance so that it has, together with said external capacitance, a first predetermined time constant, and means for adjusting said at least one integrated capacitance so that it has, together with said at lease one integrated resistance, a second predetermined time constant, wherein the adjusting means comprise control means including a logic unit integrated into the same circuit as the filter circuit.

29. A circuit arrangement for calibrating an active filter that comprises at least one integrated capacitance, at least one integrated resistance and at least one external resistive component, comprising:

means for adjusting said at least one integrated capacitance so that it has, together with said external resistance, a predetermined time constant, and means for adjusting said at least one integrated resistance so that it has, together with said at least one integrated capacitance, a predetermined time constant, wherein said means for adjusting said at least one integrated resistance and said at least one integrated capacitance comprises an RC time constant measuring circuit.

30. A circuit arrangement for calibrating an active filter that comprises at least one integrated capacitance, at least one integrated resistance and at least one external resistive component, comprising:

means for adjusting said at least one integrated capacitance so that it has, together with said external resistance, a predetermined time constant, and means for adjusting said at least one integrated resistance so that it has, together with said at least one integrated capacitance, a predetermined time constant, wherein said means for adjusting the at least one integrated resistance and the at least one integrated capacitance comprises means for determining attenuation of an RC circuit at a given frequency.

31. A circuit arrangement for calibrating an active filter that comprises at least one integrated capacitance, at least one integrated resistance and at least one external resistive component, comprising:

means for adjusting said at least one integrated capacitance so that it has, together with said external resistance, a predetermined time constant, and means for adjusting said at least one integrated resistance so that it has, together with said at least one integrated capacitance, a predetermined time constant, wherein the adjusting means comprise control means including a logic unit integrated into the same circuit as the filter circuit.

* * * * *